(12) United States Patent
Kakugawa et al.

(10) Patent No.: US 6,600,318 B1
(45) Date of Patent: Jul. 29, 2003

(54) OPEN MRI SYSTEM WITH A VERTICAL STATIC FIELD AND AN IMAGING VOLUME CLOSER TO THE LOWER THAN TO THE UPPER MAGNET ASSEMBLY

(75) Inventors: Shigeru Kakugawa, Hitachi (JP); Shouji Kitamura, Mito (JP); Nobuhiro Hara, Hitachi (JP); Akiyoshi Komura, Hitachi (JP); Noriaki Hino, Mito (JP); Hajime Kawano, Hitachinaka (JP); Takao Honmei, Hitachinaka (JP); Hirotaka Takeshima, Ryugasaki (JP); Takeshi Yatsuo, Kashiwa (JP); Hiroshi Tazaki, Kashiwa (JP)

(73) Assignee: Hitachi Medical Corporation, Tokyo (JP)

( * ) Notice: Subject to any disclaimer, the term of this patent is extended or adjusted under 35 U.S.C. 154(b) by 0 days.

(21) Appl. No.: 09/529,874
(22) PCT Filed: Aug. 28, 1998
(86) PCT No.: PCT/JP98/03850
§ 371 (c)(1),
(2), (4) Date: Apr. 20, 2000
(87) PCT Pub. No.: WO99/21476
PCT Pub. Date: May 6, 1999

(30) Foreign Application Priority Data

Oct. 24, 1997 (JP) .............................. 9-292223

(51) Int. Cl.⁷ ................................. G01V 3/00
(52) U.S. Cl. ................ 324/318; 324/319; 324/320; 324/322
(58) Field of Search ................. 324/309, 307, 324/318, 319, 320, 322

(56) References Cited

U.S. PATENT DOCUMENTS

| | | | | |
|---|---|---|---|---|
| 4,689,591 A | * | 8/1987 | McDougall ................. | 335/299 |
| 4,952,877 A | * | 8/1990 | Stormont et al. ........... | 324/312 |
| 5,245,283 A | * | 9/1993 | Provost et al. .............. | 324/309 |
| 5,307,039 A | * | 4/1994 | Chari et al. ................. | 335/299 |
| 5,386,191 A | * | 1/1995 | McCarten et al. .......... | 324/318 |
| 5,646,532 A | * | 7/1997 | Knuttel et al. .............. | 324/321 |
| 5,864,236 A | * | 1/1999 | Li ............................... | 324/320 |
| 5,936,498 A | * | 8/1999 | Takeshima et al. ......... | 335/216 |
| 6,064,290 A | * | 5/2000 | Xu et al. ..................... | 335/296 |
| 6,157,278 A | * | 12/2000 | Katznelson et al. ........ | 324/319 |
| 6,208,144 B1 | * | 3/2001 | McGinley et al. .......... | 324/319 |
| 6,230,040 B1 | * | 5/2001 | Wang et al. ................. | 600/415 |
| 6,241,669 B1 | * | 6/2001 | Furuta et al. ................ | 324/318 |
| 6,246,239 B1 | * | 6/2001 | Krogmann et al. ......... | 324/318 |
| 6,294,915 B1 | * | 9/2001 | Murphy et al. ............. | 324/318 |
| 6,335,670 B1 | * | 1/2002 | Kinanen ...................... | 335/296 |
| 6,437,672 B1 | * | 8/2002 | Takeshima et al. ......... | 335/216 |

FOREIGN PATENT DOCUMENTS

| | | |
|---|---|---|
| JP | 3284243 | 12/1991 |
| JP | 6233747 | 8/1994 |
| JP | 9153408 | 6/1997 |
| JP | 10127604 | 5/1998 |

* cited by examiner

*Primary Examiner*—Edward Lefkowitz
*Assistant Examiner*—Dixomara Vargas
(74) *Attorney, Agent, or Firm*—Cooper and Dunham, LLP.

(57) ABSTRACT

A magnet device is provided with two static magnetic field generating sources 14a and 14b disposed so as to oppose each other while placing a person to be inspected therebetween, a vessel 15 containing the static magnetic field generating source 14a and a vessel 16 containing the static magnetic field generating source 14b, and the vessels 15 and 16 are disposed at positions asymmetric with respect to the person to be inspected.

Thereby, a magnet device and an MRI device using the same which can extend a space above the person to be inspected on a bed while avoiding introduction of a large scale device which causes to increase the manufacturing cost thereof.

7 Claims, 6 Drawing Sheets

OPEN MRI SYSTEM WITH A VERTICAL STATIC FIELD AND AN IMAGING VOLUME CLOSER TO THE LOWER THAN TO THE UPPER MAGNET ASSEMBLY

FIELD OF THE INVENTION

The present invention relates to a magnetic device having two static magnetic field generating sources disposed so as to oppose each other and to a nuclear magnetic resonance imaging device (MRI) using the same.

BACKGROUND ART

FIG. 10 shows an example of super conducting magnet device used largely in conventional MRI devices.

A super conducting magnet device 171 which constitutes an MRI device includes a cylindrical hollow portion 174 near the center of which a uniform static magnetic field is generated. The super conducting magnet device 171 is constituted by divided solenoid coils wound around respective cylindrical bobbins. The coils are usually formed by super conducting wire material using NbNi, and function as super conducting coils carrying super conducting current under a condition being cooled at a temperature of about 4.2 k by liquid helium. The liquid helium is stored in a low temperature vessel not illustrated.

A patient representing an inspection body 172 is carried into the uniform magnetic field region existing within the cylindrical hollow portion 174 with a movable bed 173.

However, in a conventional MRI device using the magnet device with the above explained structure, since the patient had to enter into the narrow and small cylindrical hollow portion 174, the patient was subjected to an intense claustrophobia. For this reason, patients sometimes refused to enter into the device.

Further, it was difficult for an operator such as a medical doctor to access a person to be inspected during image taking so that a so called IVR (Interventional Radiology) was impossible.

As a technology for resolving the above problem, an open type MRI has been proposed recently as disclosed, for example, in JP-A-9-190913(1997).

The open type MRI device includes, for example, an upper magnet assembly 33 and a lower magnet assembly 34 and is constituted thereby as illustrated in FIG. 11.

In the drawing, super conducting coils 44 are disposed in a low temperature vessel 46 and which is contained in a vacuum vessel 45. The lower magnetic assembly is structured in the same manner.

In this open type MRI device a uniform static magnetic field in vertical direction is generated at a center portion of the magnet, in that on a geometrical center plane between both magnet assemblies which locates at equal distance from both magnet assemblies, and a patient 36 is carried through a movable bed 35 so that a portion to be imaged enters into a uniform magnetic field region 42.

With such open type MRI device, the patient 36 scarcely feels claustrophobia, because the patient 36 is entered into a highly open space.

However, in such conventional open type MRI device since a uniform magnetic field is generated in the region 42 which locates at equal distance from the upper and lower magnet assemblies as has been explained above, it is necessary to carry the patient to a position which locates at equal distance from the upper and lower magnet assemblies, when MRI images are taken.

For this reason, there was a problem that since a space portion 43 underside the patient operates as a dead space, a space 41 between the magnet assemblies is not effectively used. Further, in the drawing numeral 37 is an operator, numerals 38 and 39 are leakage magnetic field suppressing members belonging to the upper magnet assembly 33 and numeral 40 is a support column of magnetic material which connects and supports the upper leakage magnetic field suppressing members and like lower leakage magnetic field suppressing members.

In view of the above problems, an object of the present invention is to provide a magnet device for an MRI device and an MRI device using the same which removes a dead space between a lower magnet assembly and a bed, permits an effective use of a space between upper and lower magnet assemblies without increasing the size of the device and completing the structure thereof, and creates a broad upper space which provides a highly open space and permits for an operator to easily access a patient.

DISCLOSURE OF THE INVENTION

One aspect of the present invention for achieving the above object is to provide a magnet device which is characterized, in that the magnet device comprises, two static magnetic field generating sources which are disposed so as to oppose each other while placing an inspection body therebetween;

a first vessel which contains one of the two static magnetic field generating sources; and a second vessel which contains the other of the two static magnetic field generating sources, wherein the first vessel and the second vessel are disposed at positions asymmetric with respect the inspection body.

Another aspect of the present invention for achieving the above object is to provide a static magnetic field generating device for an open type MRI device which is characterized, in that the static magnetic field generating device comprises a pair of magnet assemblies which are disposed in vertical direction opposing each other while sandwiching a space for receiving a person to be inspected and respectively generate magnetic fields in vertical direction, wherein an absolute value of total magnetic moment produced by an upper magnet assembly is set larger than an absolute value of total magnetic moment produced by a lower magnet assembly in the pair of magnet assemblies so that a uniform magnetic field region produced by the pair of magnet assemblies covers a position of the person to be inspected who is laid on a lower position than a geometrical center plane of the space formed by the pair of magnet assemblies.

BEST MODES FOR CARRYING OUT THE PRESENT INVENTION

Hereinbelow, several embodiments of the present invention will be explained with reference to the drawings.

Figure 1:
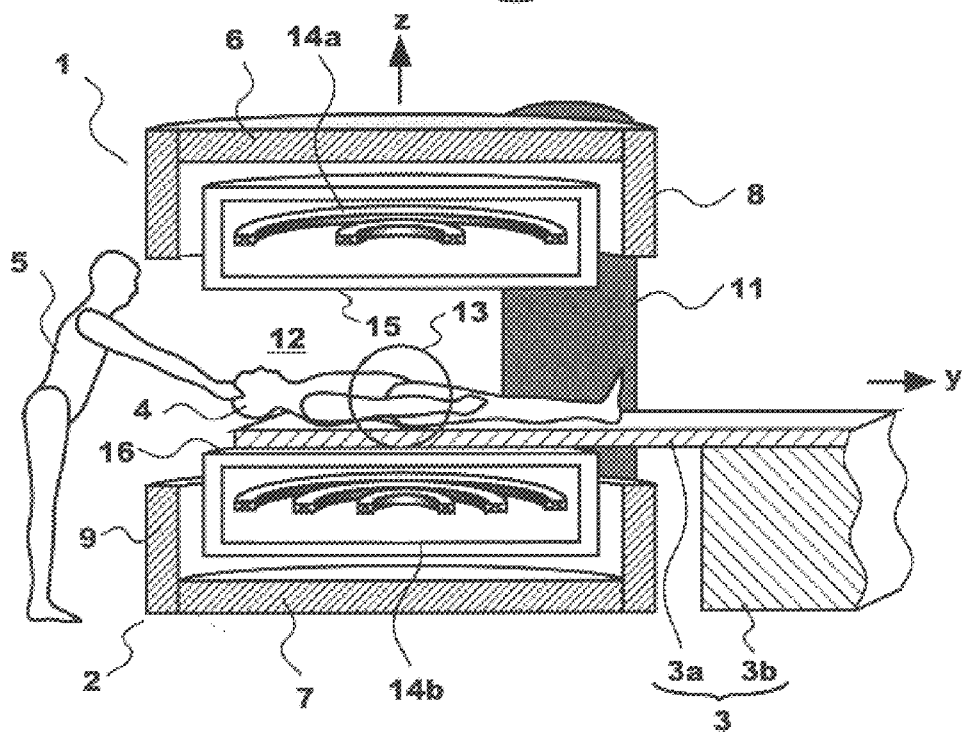
FIG. 1 is a schematic cross sectional diagram of a part of an open type MRI device representing a first embodiment according to the present invention.
Figure 2:
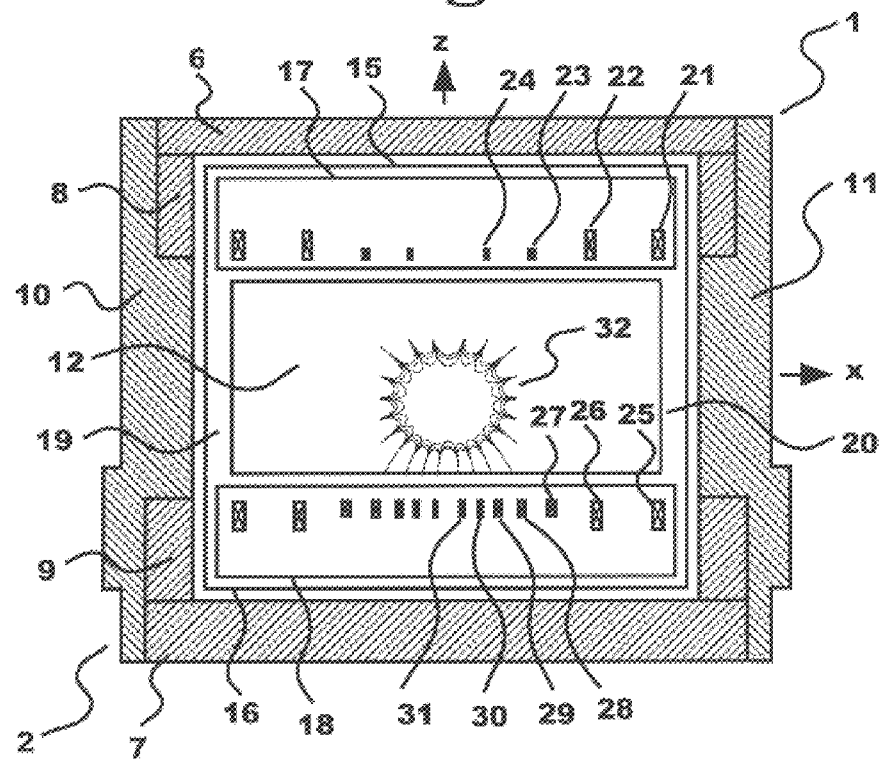
FIG. 2 is a cross sectional view of a magnet device constituting the MRI device of FIG. 1 taken along z-x plane thereof and an explanatory view showing contours of magnetic field uniformity thereof.

FIG. 1 shows a schematic cross sectional view of a part of an open type MRI device representing a first embodiment according to the present invention. FIG. 2 shows a cross sectional view of a super conducting magnet device constituting the open type MRI device as shown in FIG. 1 taken along z-x plane thereof and shows contours representing magnetic field uniformity on z-x plane thereof.

The open type MRI device generates uniform magnetic field in vertical direction in an open space 12 by upper and lower magnet assemblies 1 and 2 and permits to take MRI images, and wherein the open space 12 implies a space existing between a movable table portion 3a for a bed 3 on which a patient 4 is laid and the upper magnet assembly 1.

Since the present invention is constituted in such a manner that the total magnetic moment of the upper magnet assembly 1 is larger than that of the lower magnet assembly 2 which will be explained in detail later, a uniform magnetic field region 13 locates at a position offset toward lower side from a geometrical center portion in a space between the upper and lower magnet assemblies 1 and 2 which is at equal distance from the both.

The bed 3 is constituted by the movable table 3a for carrying the patient 4 and a support stand 3b for supporting the same. The height of the movable table 3a from the floor surface is adjusted in advance so that the imaging portion of the patient 4 enters into the uniform magnetic field region 13. Namely, when making a reference to vessel 15 containing a static magnetic field generating source 14a and a vessel 16 containing a static magnetic field generating source 14b, the vessels 15 and 16 are disposed at positions asymmetric in vertical direction with respect to the patient 4.

Figure 11:
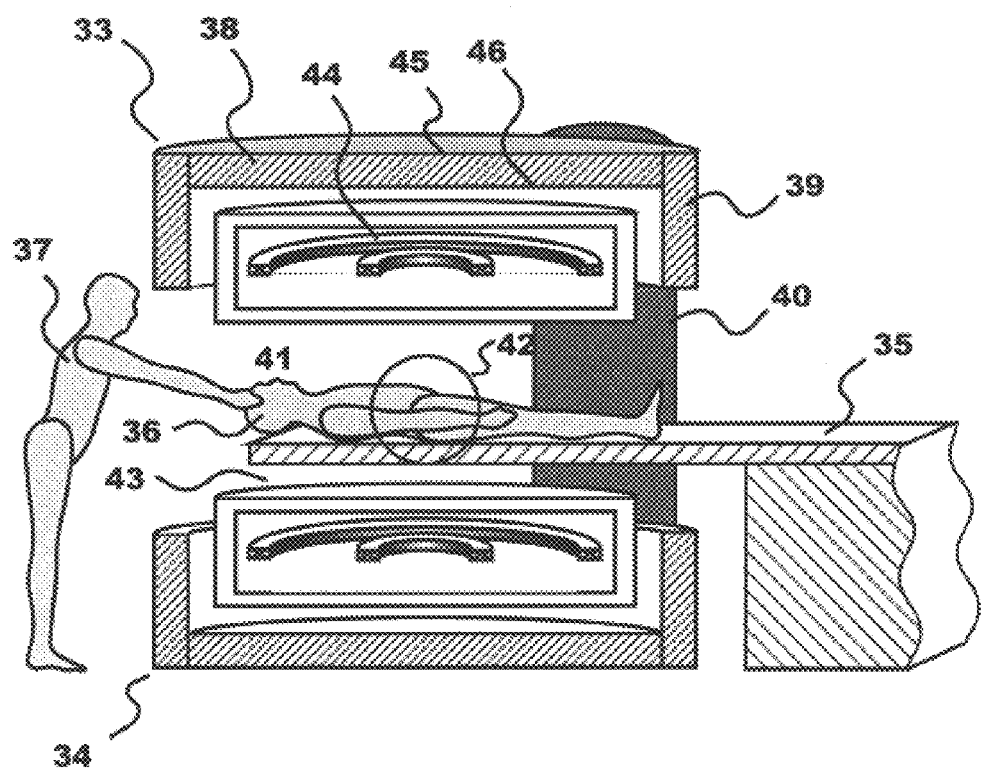
FIG. 11 is a schematic cross sectional view of a part of a conventional open type MRI device.

When arranging the elements as has been explained above, a dead space 43 below the patient 4 is reduced in comparison with the conventional open type MRI device as shown in FIG. 11 and correspondingly the open space can be enlarged.

In this instance, claustrophobia affected to the patient 4 on the bed 3 is decreased and psychological pressure with respect to the image taking operation is extremely reduced.

Further, since a medical doctor (or an inspection engineer) 5 can easily access the patient 4 on the bed 4, an applicability to IVR (Interventional Radiology) is enhanced and a capability of medical treatment can be greatly extended.

Further, since an open type MRI device is generally a vertical magnetic field type device (in which the direction of static magnetic field is orthogonal with respect to the longitudinal direction of a human body), a solenoid coil can be used for a probe for receiving NMR signals. The sensitivity of such solenoid type probe is theoretically 1.4 times higher than that of a saddle shaped (or bird cage shaped) probe used for the horizontal magnetic field type MRI device as shown in FIG. 10.

Figure 10:
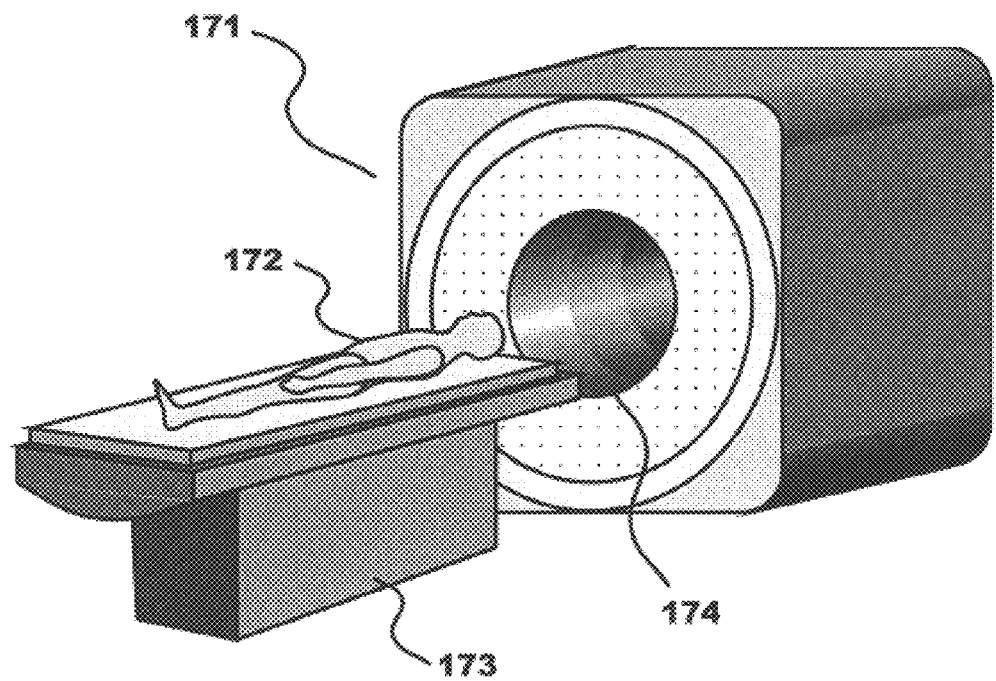
FIG. 10 is a perspective view of a conventional horizontal magnetic field type MRI device.

Accordingly, when assuming that the center magnetic field intensity is equal each other, the present MRI device of the vertical magnetic field type can take a further accurate tomographic images with a further higher speed in comparison with the conventional device as shown in FIG. 10.

Subsequently, a specific structure of the magnet device will be explained with reference to FIG. 2.

Super conducting coils 21 through 31 are arranged substantially symmetrically with respect to the center axis (z axis) of the magnet device and generate a uniform magnetic field in vertical direction (namely in z axis direction).

The upper and lower super conducting coils are respectively disposed inside respective upper and lower cooling vessels 17 and 18, and the upper and lower cooling vessels 17 and 18 are contained in respective vacuum vessels 15 and 16. Further, although not illustrated in the drawing, the respective super conducting coils are supported by specific supporting structures and a heat shield member is provided between the vacuum vessel and the cooling vessel so as to prevent penetration of radiation heat thereinto. Liquid helium is stored inside the cooling vessel and cools the super conducting coils to a super low temperature of 4.2 k. The upper and lower vacuum vessels 15 and 16 are coupled by coupling tubes 19 and 20, and are held with predetermined distance.

Further, the coupling tubes 19 and 20 can be formed in a double tube structure so as to mechanically support the upper and lower vacuum vessels 15 and 16 as well as to thermally connect the upper and lower cooling vessels 17 and 18.

When the vessels are constituted as has been explained above, it becomes unnecessary to provide a cryostat each for the upper and lower vessels, thereby, the system can be operated with one cryostat.

Further, the number of the coupling tubes 19 and 20 and support columns 10 and 11 supporting the upper magnet assembly 1 which will be explained later is not limited two, but can be increased three, four and more. Further, in order to obtain a further open feeling only one support column forming an overhang structure can be used.

Now, the structure of the upper magnet assembly 1 and the lower magnet assembly 2 will be explained in detail.

As shown in FIGS. 1 and 2, the upper magnet assembly 1 and lower magnet assembly 2 are constituted to have an asymmetric structure with respect to a geometrical center plane (an imaginary plane locating with equal distance from the magnet assemblies 1 and 2) of the magnet device. Accordingly, the center of uniform magnetic field region 13 produced by the upper and lower magnetic assemblies 1 and 2 occupies a position offset in either direction with respect to the geometrical center plane of the magnet device, and in the present embodiment occupies the lower side thereof.

When assuming that the center axis of the magnet device is z axis, r and θ represent a coordinate position in a polar coordinate assuming the center of the magnet device as origin and Pn(cos θ) is Legendre's function of nth degree, magnetic field Bz in z direction near the center portion of the magnet device can generally be developed and expressed in the following equation (1);

$$Bz = \sum_{n=0}^{\infty} d_n r^n P_n(\cos\theta) \quad (1)$$

wherein do is a uniform magnetic field and $d_1$, $d_2$, $d_3$, $d_4$, $d_5$, $d_6$ ... are irregular magnetic field which deteriorate uniformity of magnetic field.

Accordingly, in order to generate an aimed uniform magnetic field it will be sufficient to eliminate successively the irregular magnetic field components $d_1$, $d_2$, $d_3$, $d_4$, $d_5$, $d_6$ ... among the developed terms in equation (1) in the order from lower terms.

Further, as seen from the equation (1), it will be understood that if the irregular magnetic field components are eliminated up to high degree terms, a space of uniform magnetic field will be extended.

A magnet device for an MRI device used such as in hospitals is required to generate a uniform magnetic field within ±10 ppm variation rate in a spherical region having a diameter of 40 cm~50 cm.

In order to fulfill the above requirement, the upper and lower magnet assemblies 1 and 2 are usually constituted in such a manner that the irregular magnetic field components from the first degree to 8th degree (or 10th degree) in the above equation (1), namely $d_1$, $d_2$, $d_3$, ... $d_8$, $d_9$ and $d_{10}$, are rendered to be zero.

Further, in such instance, when the upper and lower magnet assemblies are arranged in symmetry with respect to the geometric center plane thereof, the odd order degrees $d_1$, $d_3$, $d_5$ ... among the above irregular magnetic field components assume zero.

However, in the magnet device according to the present embodiment, since the arrangement structure of the upper and lower magnet assemblies shows non-symmetric characteristic with respect to the geometric center plane thereof, the irregular magnetic field components of odd order degree $d_1$, $d_3$, $d_5$ ... have to be rendered to zero by adjusting design parameters thereof.

Namely, in the magnet device according to the present embodiment, the irregular magnetic field components regardless to odd and even order degrees from first order degree to eighth order degree (or tenth order degree) have to be rendered to be zero by adjusting design parameters such as arrangement of unit coils and ampere turns thereof, and moreover a uniform magnetic field has to be generated in a region offset toward the lower magnet assembly.

For realizing the principle of the present invention as has been explained above, it is preferable to constitute the respective upper and lower magnet assemblies as follows.

At first, the absolute value of magnetic moment of the upper magnet assembly is set larger than the absolute magnetic moment of the lower magnet assembly. When assuming that a radius of a coil is r, a magnetic moment generated by the coil is generally expressed as $\pi \times r^2 \times$ (magnetomotive force of the coil). Accordingly, while adjusting these parameters in connection with respective coils in the upper and lower magnet assemblies, the absolute value of magnetic moment of the upper magnet assembly is determined larger than the absolute value of magnetic moment of the lower magnet assembly.

Thereby, if the directions of the magnetic moments of the upper and lower magnet assemblies are the same, a uniform magnetic field region is produced near the lower magnet assembly.

Figure 4:
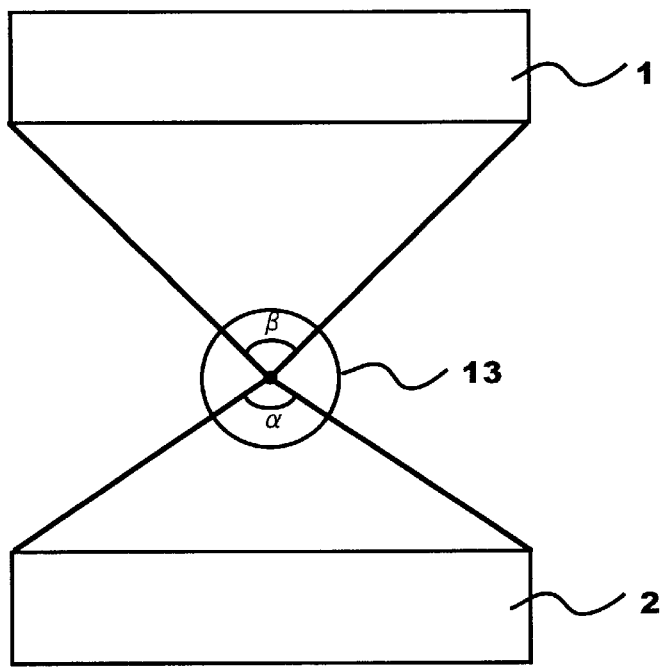
FIG. 4 is an explanatory view showing solid angles occupied by respective magnet assemblies seen from a center of uniform magnetic field region for explaining the present invention.

Further, when the center of the uniform magnetic field region locates near the lower magnet assembly 2, and when the upper magnet assembly 1 and the lower magnet assembly 2 are seen from the center of the uniform magnetic field region, solid angle α occupied by the lower magnet assembly 2 becomes larger than solid angle β occupied by the upper magnet assembly as shown in FIG. 4.

Figure 3:
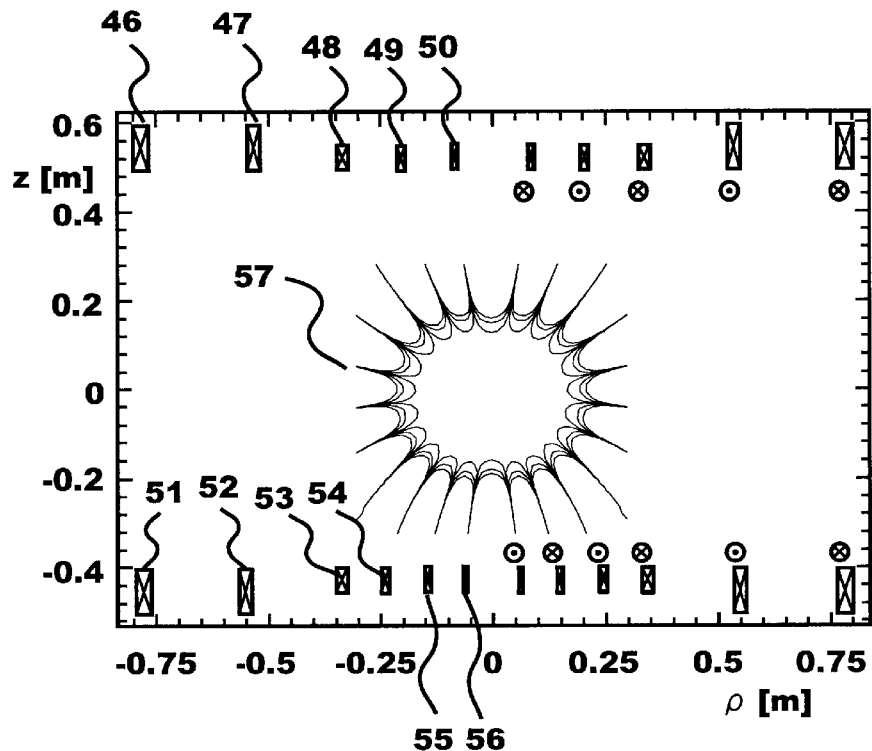
FIG. 3 is a cross sectional view of a magnet device representing a second embodiment according to the present invention taken along z-x plane thereof and an explanatory view showing contours of magnetic field uniformity thereof.

Amplitudes of the irregular magnetic field components vary in a radial direction from the center of the uniform magnetic field region 57 as shown in FIG. 3, for the magnet assembly having a larger solid angle when viewed from the center of the uniform magnetic field region (namely, the lower magnet assembly), number of variation peaks of irregular magnetic field components to be eliminated is large in comparison with the magnet assembly having a smaller solid angle (namely, upper magnet assembly).

Accordingly, the number of unit coils in the magnet assembly near the uniform magnetic field region (the lower magnet assembly) is selected larger than the number of unit coils in the other magnet assembly (the upper magnet assembly). As a result, controll-ability of irregular magnetic field components of high order degrees by the lower magnet assembly is enhanced.

Secondly, directions of current flow in unit coils in the respective magnet assemblies are determined in such a manner that the current flow direction varies alternatively in positive and negative directions for adjacent unit coils. Thereby, irregular magnetic field components including odd order degrees thereof are eliminated with the minimum number of unit coils.

Thirdly, the sum of absolute values of magnetomotive force of the unit coils in the lower magnet assembly is set larger than the sum of absolute values of magnetomotive force of the unit coils in the upper magnet assembly. As has been explained above, since in the lower magnet assembly the unit coils in alternative positive and negative polarities are arranged in higher density than those in the upper magnet assembly, the efficiency of magnet field generation therein decreases. Accordingly, in order to generate a predetermined magnetic moment the magnetomotive forces of the unit coils are adjusted as above.

Moreover, in the respective magnet assemblies, the absolute value of magnetomotive force of the unit coil having the largest radius is determined larger than the absolute values of magnetomotive forces of other unit coils. Since the unit coil having the largest radius is located at a comparatively distant position from the uniform magnetic field region, it is preferable in view of total efficiency of the magnet to determine the absolute value of magnetomotive force of the unit coil having the largest radius larger than the absolute values of magnetomotive force of the other unit coils.

FIG. 3 is a second embodiment of a magnet assemblies which are constituted based on the several specific requirements as has been explained above.

In FIG. 3, the distance between the upper and lower super conducting coils is 0.9 m, the outer diameter of the largest unit coil is 1.6 m, current density in the respective unit coils is 170 A/mm$^2$, the center magnetic field intensity is 0.4 T and the center of the uniform magnetic field region is offset by 5 cm below the geometric center plane of the coil distance. Further, in FIG. 3, the contours 57 of the magnetic field uniformity are shown. The contours 57 show with variation rates of ±1, ±5 and ±10 ppm from the inside thereof. In the present embodiment, since the irregular magnetic field components from the first order degree to tenth order degree in the uniform magnetic field region are rendered to be zero, the magnetic field uniformity in the drawing is primarily controlled by the irregular magnetic field component of 11th order degree.

Thus, the upper and lower magnet assemblies as shown in FIG. 3 satisfy the respective conditions as referred to above.

Firstly, the absolute value of the total magnetic moments of the upper main unit coils 46, 47, 48, 49 and 50 is larger than the absolute value of the total magnetic moments of the lower main unit coils 51, 52, 53, 54, 55 and 56.

Secondly, number of the upper main unit coils is 5 and the number of the lower main unit coils is 6, in that the number of unit coils in the lower magnet assembly is more than the number of unit coils in the upper magnet assembly.

Thirdly, in the respective magnet assemblies, the unit coils are arranged in such a manner that the current flow direction therein varies alternatively in positive and negative direction along the arrangement thereof. Namely, the current flows in the respective unit coils in such a manner that when assuming the current flow direction in the main unit coils 46, 48, 50, 51, 53 and 55 is in positive direction, the current flow direction in the main unit coils 47, 49, 52, 54 and 56 is in negative direction.

Fourthly, the sum of absolute values of the magnetomotive force of the respective unit coils in the lower magnet assembly is larger than the sum of absolute values of magnetomotive force of the respective unit coils in the upper magnet assembly. More specifically, the sum of absolute values of magnetomotive force of the lower main unit coils 51, 52, 53, 54, 55 and 56 is larger than the sum of absolute values of magnetomotive force of the upper main unit coils 46, 47, 48, 49 and 50.

Fifthly, in the respective magnet assemblies, the absolute value of magnetomotive force of the unit coil having the largest radius is larger than the absolute values of magnetomotive force of the other remaining unit coils. Namely, the absolute value of magnetomotive force of the upper main unit coil 46 is larger than the absolute values of magnetomotive force of the other upper main unit coils 47, 48, 49 and 50, and the absolute value of magnetomotive force of the lower main unit coil 51 is larger than the absolute values of magnetomotive force of the other lower main unit coils 52, 53, 54, 55 and 56.

When the magnet assemblies are constituted as has been explained, the uniform magnetic field is generated at the region 57 which is offset toward the lower magnet assembly from the center of the gap distance between the upper and lower magnet assemblies.

Further, in the first embodiment, the coil arrangement as shown in FIG. 2 is used which is different from the second embodiment as has been explained hitherto. However, the first embodiment also satisfies the above referred to conditions, although such as number of coils is different from that of the second embodiment.

Namely, the absolute value of total magnetic moment of the upper magnet assembly 1 is larger than the absolute value of total magnetic moment of the lower magnet assembly 2. The number of unit coils in the upper magnet assembly 1 is 4 and the number of unit coils in the lower magnet assembly 2 is 7. In the respective magnet assemblies 1 and 2, the respective unit coils are arranged so that the current flow directions therein vary alternatively in positive and negative directions along the arrangement direction. Namely, the current flows in the respective unit coils in such a manner that when assuming the current flow direction in the main unit coils 21, 23, 25, 27, 29 and 31 is in positive direction, the current flow direction in the main unit coils 22, 24, 26, 28 and 30 assumes in negative direction. The sum of absolute values of magnetomotive force of the respective unit coils in the lower magnet assembly 2 is larger than the sum of absolute values of magnetomotive force of the respective unit coils in the upper magnet assembly 1. Further, for the respective magnet assemblies 1 and 2, the absolute value of magnetomotive force of a unit super conducting coil having the largest radius is larger than the absolute values of magnetomotive force of the other unit super conducting coils. Namely, the absolute value of magnetomotive force of the upper main unit coil 21 is larger than the absolute values of respective magnetomotive forces of the other upper main unit coils 22, 23 and 24, and the absolute value of magnetomotive force of the lower main unit coil 25 is larger than the absolute values of respective magnetomotive forces of the other lower main unit coils 26, 27, 28, 29, 30 and 31. Further, the absolute value of magnetomotive force of the unit super conducting coil 25 having the largest radius in the lower magnet assembly 2 is larger than the absolute value of magnetomotive force of the unit super conducting coil 21 having the largest radius in the upper magnet assembly 1.

The interval of the upper and lower super conducting coils is 0.9 m, the outer diameter of the largest unit coil is 1.6 m, the current density of the respective unit coils is 170 A/mm$^2$, and the center magnetic field intensity is 0.4 T.

In FIG. 2, the contours of magnetic field uniformity show variation rates of ±1, ±5 and ±10 from the inside thereof. In the same manner as in the second embodiment, since the irregular magnetic field components from the first order degree to tenth order degree in the uniform magnetic field region are rendered to be zero, the magnetic field uniformity in the drawing is primarily controlled by the irregular magnetic field component of 11th order degree.

As the result of the coil design as has been referred to above, a uniform magnetic field with variation rate ±10 ppm/40 cm d s v (diameter of spherical volume) can be generated at region 32 which locates 10 cm below the geometric center plane between the upper and lower magnet assemblies 1 and 2, of which result fully satisfies a specification for a magnet device used for whole-body MRI device.

In the above, the features of the upper and lower magnet assemblies according to the present embodiment have been explained, the present embodiment further includes a leakage magnetic field suppressing member which is designed to form magnetic flux passages surrounding the upper and lower magnetic field generating sources to thereby suppress possible leakage magnetic fields.

In the present embodiment, as the leakage magnetic field suppressing member, disk shaped ferromagnetic bodies 6 and 7, cylindrical ferromagnetic bodies 8 and 9 and column shaped ferromagnetic bodies are provided.

As has been explained above, the absolute value of magnetomotive force of the unit super conducting coil 25 having the largest radius in the lower magnet assembly 2 is set larger than the absolute value of magnetomotive force of the unit super conducting coil 21 having the largest radius in the upper magnet assembly 1.

Therefore, in the present embodiment, in order to fully achieve the shielding effect, the upper and lower the ferromagnetic bodies provided as the leakage magnetic field suppressing members are configulated asymmetric.

More specifically, the cross sectional area of magnetic flux passage for the ferromagnetic body near the unit super conducting coil 25 is increased by increasing the thickness thereof in comparison with that of the upper ferromagnetic bodies.

Figure 5:
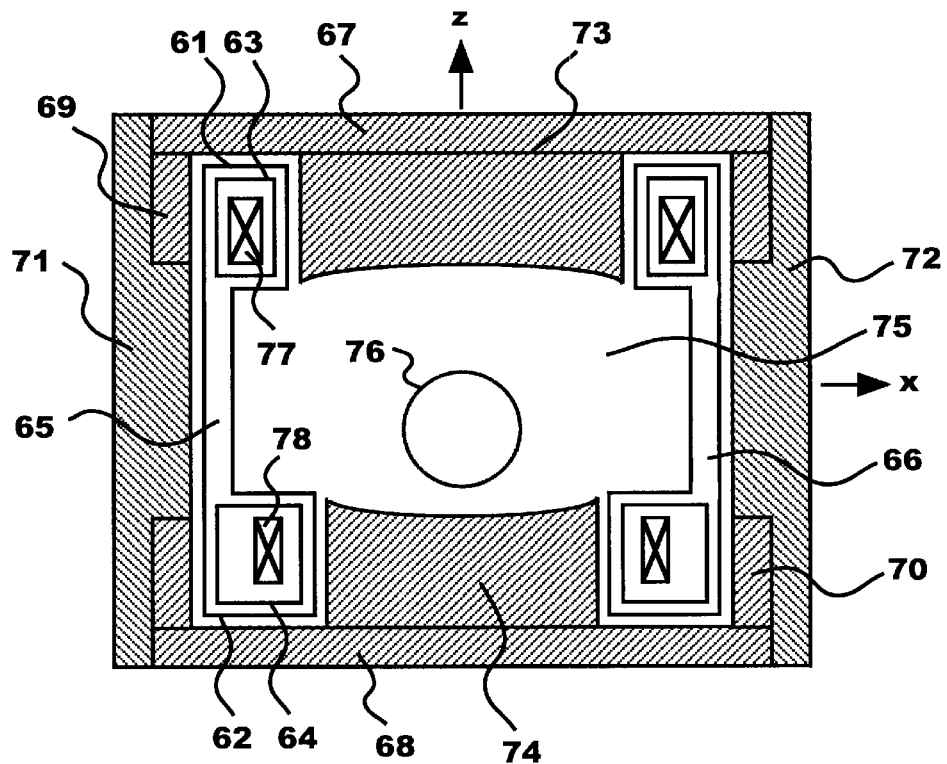
FIG. 5 is a schematic cross sectional diagram of a magnet device representing a third embodiment according to the present invention taken along z-x plane thereof.

FIG. 5 is a cross sectional view of a super conducting magnet device used for an open type MRI device representing a third embodiment according to the present invention.

The present embodiment is provided with super conducting coils 77 and. 78 and ferromagnetic bodies 73 and 74 functioning as magnetic poles, and the super conducting coils 77 and 78 generate magnetomotive forces, and primarily through the configuration of the ferromagnetic bodies 73 and 74 a uniform magnetic field is generated at a position offset from the geometric center plane of the coils.

More specifically, the magnetomotive force of the upper super conducting coil 77 is set larger than that of the lower super conducting coil 78, and in order to keep a necessary controllability with regard to the uniform magnetic field region, the diameter of the upper magnet pole 73 is selected larger than the diameter of the lower magnet pole 74. Further, on the magnet pole face of the lower magnet pole 74 ring shaped grooves are formed in higher density than those formed on the magnet pole face of the upper magnet pole 73.

With the above structure, a uniform magnetic field with variation rate of a few ppm can likely be generated at a region 76 below the geometric center plane in a space 75 between the upper and lower magnet assemblies.

Further, the present embodiment is also provided with disk shaped ferromagnetic bodies 67 and 68, other disk shaped ferromagnetic bodies 69 and 70 and support column shaped ferromagnetic bodies 71 and 72 as the leakage magnetic field suppressing members.

The upper and lower super conducting coils 77 and 78 are disposed in respective cooling vessels 63 and 64 which are then contained in respective vacuum vessels 61 and 62. The upper and lower vacuum vessels 61 and 62 are coupled by coupling tubes 65 and 66, and are held thereby with a predetermined interval.

Figure 6:
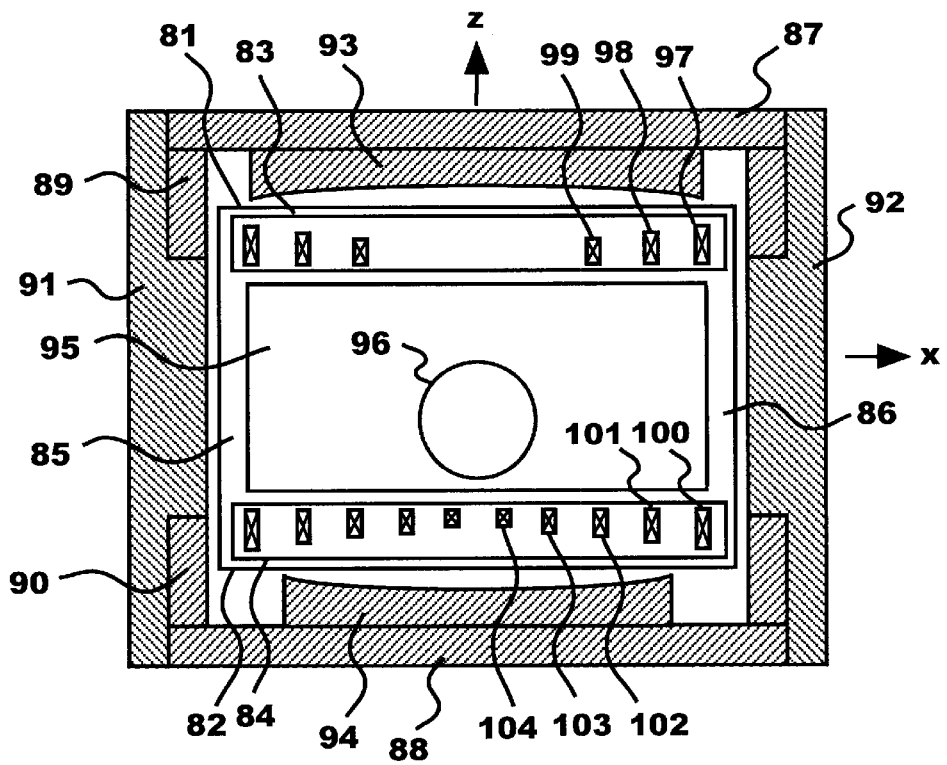
FIG. 6 is a schematic cross sectional diagram of a magnet device representing a fourth embodiment according to the present invention taken along z-x plane thereof.

FIG. 6 is a cross sectional view of a super conducting magnet device used for an open type MRI device representing a fourth embodiment according to the present invention.

In order to generate a uniform magnetic field at a position offset from the geometric center plane of the coils, in the present embodiment, ferromagnetic bodies 93 and 94 functioning as magnetic poles and being arranged behind the respective coil assemblies primarily work to strengthen the center magnetic field intensity, and the uniform magnetic field at the offset position is primarily realized by the respective unit coils. When the center magnetic field intensity is strengthened by the ferromagnetic bodies 93 and 94, the magnetomotive forces to be shared by the respective unit coils can be reduced. Herein, the diameter of the upper magnetic pole 93 is likely set larger than the diameter of the lower magnetic pole 94.

The number of unit coils in the upper magnet assembly is 3 and the number of unit coils in the lower magnet assembly is 5, in that like the first embodiment as shown in FIG. 2, the number of unit coils in the lower magnet assembly is determined more than that in the upper magnet assembly. The current flow direction in the respective unit super conducting coils is determined in such a manner that the current flow directions in the unit coils are arranged alternatively in positive and negative directions along the radial arrangement direction of the unit coils. Namely, the currents flow in the respective unit coils in such a manner that, when assuming the current flow direction of the main unit coils 97, 99, 100, 102 and 104 is in positive direction, the current flow direction of the main unit coils 98, 101 and 103 is in negative direction.

With the above structure, a uniform magnetic field with variation rate of a few ppm can likely be generated at a region 96 below the geometric center plane in a space 95 between the upper and lower magnet assemblies.

Further, the present embodiment is also provided with disk shaped ferromagnetic bodies 87 and 88, other disk shaped ferromagnetic bodies 89 and 90 and support column shaped ferromagnetic bodies 91 and 92 as the leakage magnetic field suppressing members.

The upper and lower super conducting coils are disposed in respective cooling vessels 83 and 84 which are then contained in respective vacuum vessels 81 and 82. The upper and lower vacuum vessels 81 and 82 are coupled by coupling tubes 85 and 86 and are held thereby with a predetermined interval.

Figure 7:
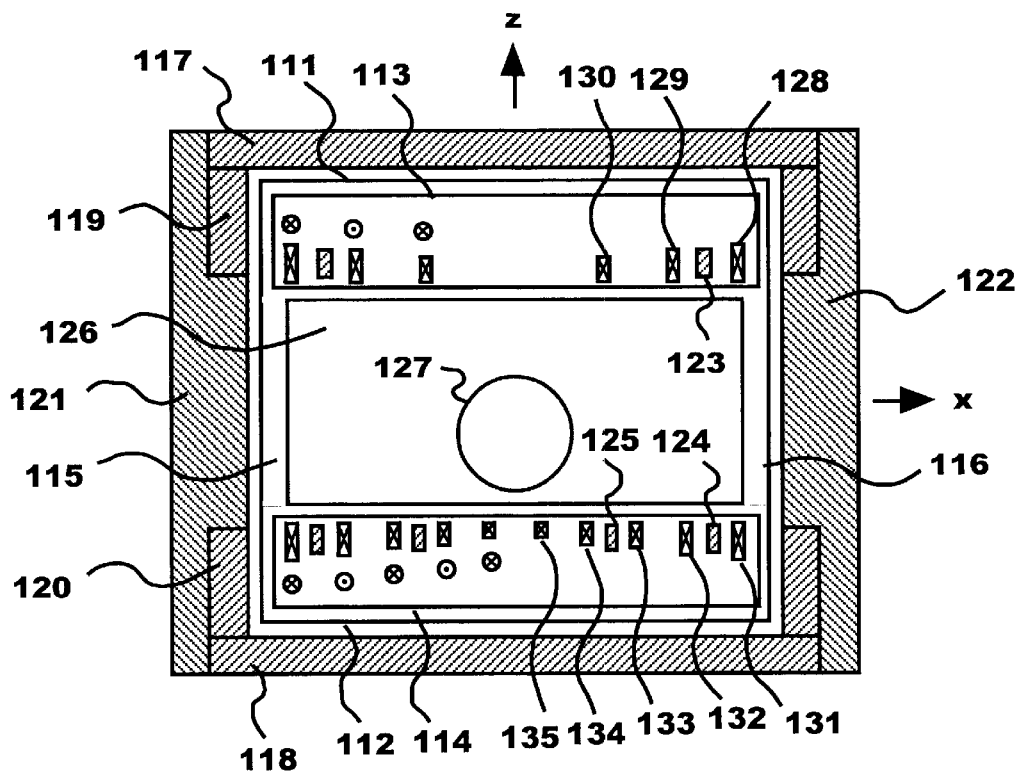
FIG. 7 is a schematic cross sectional diagram of a magnet device representing a fifth embodiment according to the present invention taken along z-x plane thereof.

FIG. 7 is a cross sectional view of a super conducting magnet device used for an open type MRI device representing a fifth embodiment according to the present invention.

Herein, ferromagnetic bodies are disposed inside the cooling vessels. Those ferromagnetic bodies effect to save magnetomotive forces to be generated by the unit coils as well as help to form the uniform magnetic field at an offset position.

The number of unit coils in the upper magnet assembly is 3 and the number of unit coils in the lower magnet assembly is 5, in that like the first embodiment as shown in FIG. 2, the number of unit coils in the lower magnet assembly is determined more than that in the upper magnet assembly.

The ferromagnetic bodies 123, 124 and 125 are respectively formed in a ring shape, and are respectively disposed between the unit super conducting coils.

In the present embodiment, a single internal ferromagnetic body is provided in the upper magnet assembly and two internal ferromagnetic bodies are provided in the lower magnet assembly. However, depending on the design condition thereof, the number of the ferromagnetic bodies in the upper magnet assembly can be determined more than the number of ferromagnetic bodies in the lower magnet assembly.

Herein, also the current flow direction in the respective unit super conducting coils is determined in such a manner that the current flow directions in the unit coils are arranged alternatively in positive and negative directions along the radial arrangement direction of the unit coils.

With the above structure, a uniform magnetic field with variation rate of a few ppm can likely be generated at a region 127 below the geometric center plane in a space 126 between the upper and lower magnet assemblies.

Further, the present embodiment is also provided with disk shaped ferromagnetic bodies 117 and 118, other disk shaped ferromagnetic bodies 119 and 120 and support column shaped ferromagnetic bodies 121 and 122 as the leakage magnetic field suppressing members.

The upper and lower super conducting coils are disposed in respective cooling vessels 113 and 114 which are then contained in respective vacuum vessels 111 and 112. The upper and lower vacuum vessels 111 and 112 are coupled by coupling tubes 115 and 116 and are held thereby with a predetermined interval.

Figure 8:
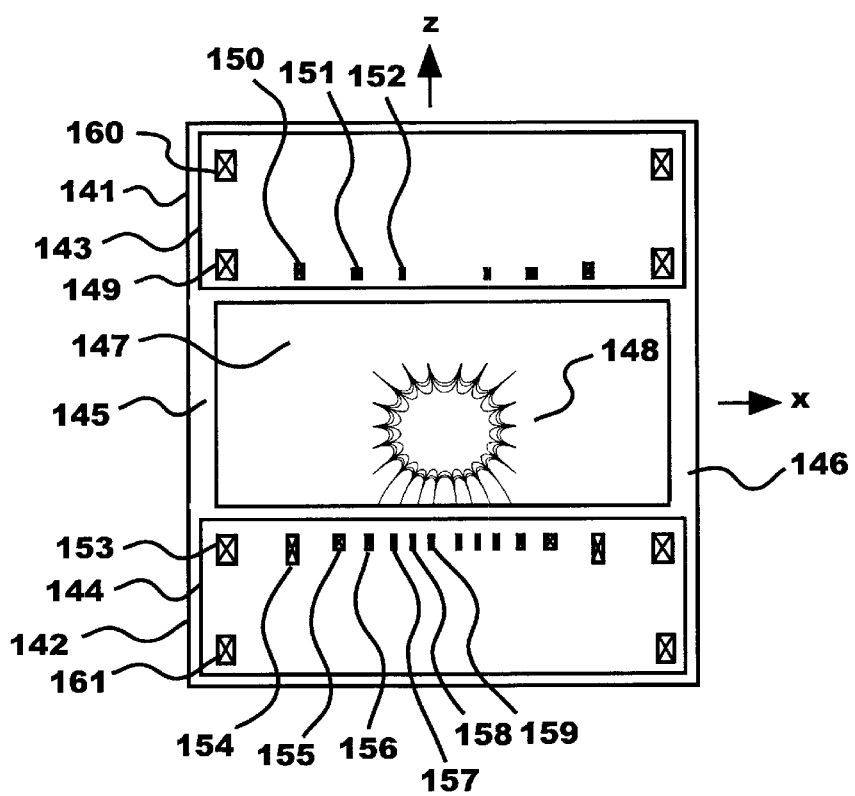
FIG. 8 is a schematic cross sectional diagram of a magnet device representing a sixth embodiment according to the present invention taken along z-x plane thereof.

FIG. 8 is a cross sectional view of a super conducting magnet device used for an open type MRI device representing a sixth embodiment according to the present invention.

Herein, instead of disposing the leakage magnetic field suppressing members, a method of shielding leakage magnetic field with shielding coils (a so called active shielding method) is employed.

As shown in FIG. 8, the upper magnet assembly is provided with four main unit super conducting coils 149, 150, 151 and 152 and one shielding use super conducting coil 160.

On the other hand, the lower magnet assembly is provided with seven main unit super conducting coils 153, 154, 155, 156, 157, 158 and 159 and one shielding use super conducting coil 161. The current flow direction in the respective main unit super conducting coils in the respective magnet assemblies is determined in such a manner that the current flow directions in the unit coils are arranged alternatively in positive and negative directions along the radial arrangement direction of the unit coils.

Further, the respective shielding use super conducting coils 160 and 161 are disposed at positions distant from the image taking space in comparison with the positions of respective main unit super conducting coils and on concentric circles as those of the respective main unit super conducting coils, and further, the current flow directions in the respective shielding use super conducting coils 160 and 161 is determined opposite to those of the main unit super conducting coils 149 and 153 having the maximum diameter.

In the present embodiment, the distance between the upper and lower super conducting coils is 0.9 m, the outer diameter of the largest unit coil is 1.6 m, current density in the respective unit coils is 170 A/mm$^2$, and the center magnetic field intensity is 0.4 T. The contours 148 of the magnetic field uniformity show variation rates of ±1, ±5 and ±10 ppm from the inside thereof. Like the above embodiments, since the irregular magnetic field components from the first order degree to tenth order degree in the uniform magnetic field region are rendered to be zero, the magnetic field uniformity in FIG. 8 embodiment is primarily controlled by the irregular magnetic field component of 11th order degree.

Further, the sum of absolute values of magnetomotive force of the main unit super conducting coils 153, 154, 155, 156, 157, 158 and 159 in the lower magnet assembly is set larger than the sum of absolute values of magnetomotive force of the main unit super conducting coils 149, 150, 151 and 152 in the upper magnet assembly.

Still further, the absolute value of total magnetic moments of the main unit super conducting coils 149, 150, 151 and 152 in the upper magnet assembly is set larger than the absolute value of total magnetic moments of the main unit super conducting coils 153, 154, 155, 156, 157, 158 and 159 in the lower magnet assembly.

Still further, in the respective magnet assemblies, the absolute value of magnetomotive force of the main unit super conducting coil having the largest radius is set larger than the absolute values of magnetomotive force of the other main unit super conducting coils. Namely, the absolute value of magnetomotive force of the upper main unit coil 149 is set larger than the respective absolute values of magnetomotive force of the other upper main unit coils 150, 151 and 152, and the absolute value of magnetomotive force of the lower main unit coil 153 is set larger than the respective absolute values of magnetomotive force of the other lower main unit coils 154, 155, 156, 157, 158 and 159.

Still further, the absolute value of magnetomotive force of the shielding use super conducting coil 160 in the upper magnet assembly is set larger than the absolute value of magnetomotive force of the shielding use super conducting coil 161 in the lower magnet assembly.

Still further, the absolute value of magnetic moment by the shielding use super conducting coil 160 in the upper magnet assembly is set larger than the absolute value of magnetic moment by the shielding use lower super conducting coil 161.

Even with the structure of the present embodiment, a uniform magnetic field with variation rate ±10 ppm/40 cm d s v (diameter of spherical volume) can be generated at region 147 which locates 10 cm below the geometric center plane between the upper and lower magnet assemblies, of which result fully satisfies a specification for a magnet device used for whole-body MRI device.

Figure 9:
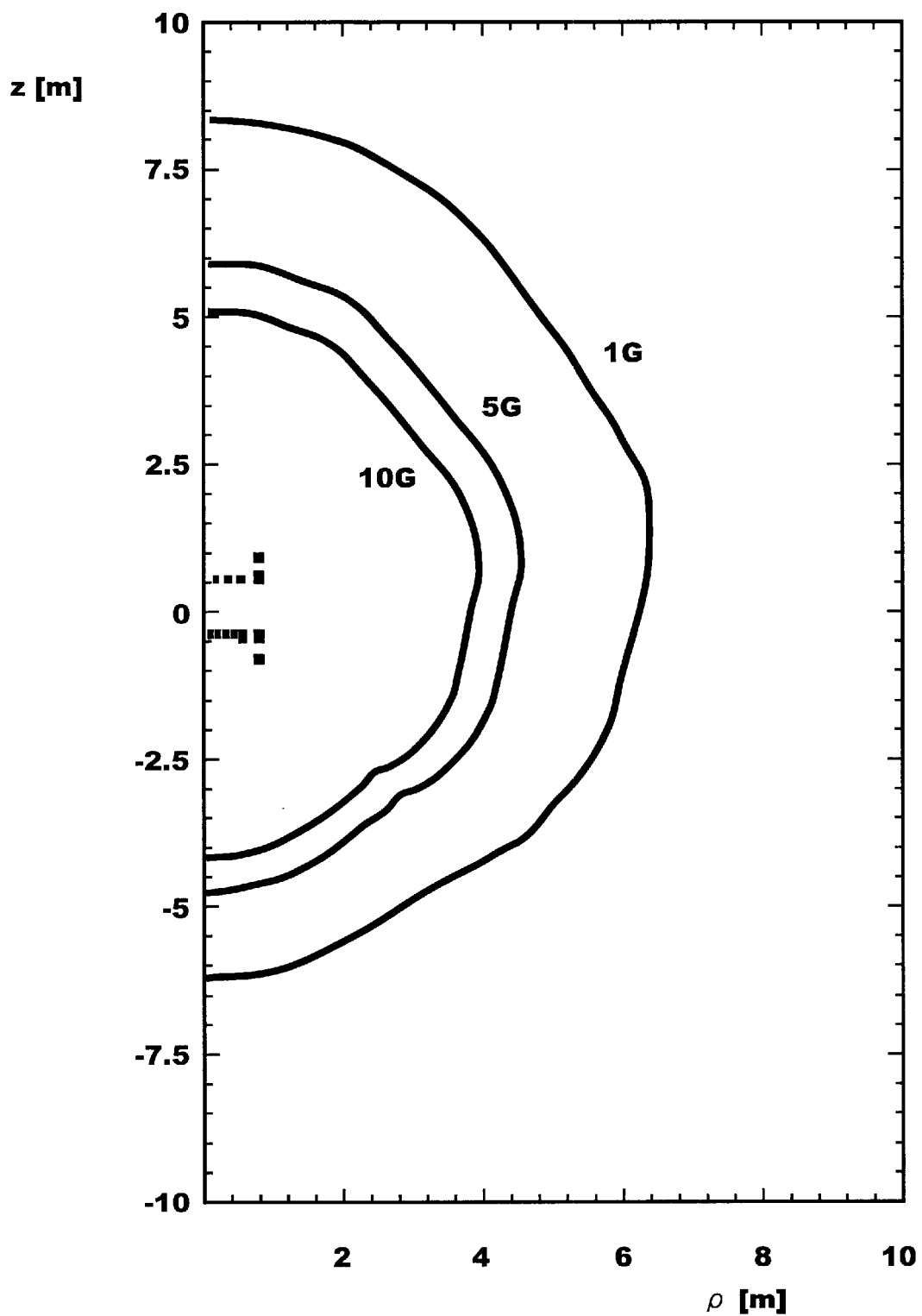
FIG. 9 is an explanatory view showing a distribution of leakage magnetic field of the magnet device representing the sixth embodiment according to the present invention.

FIG. 9 shows contours of leakage magnetic field of the magnet device according to the present embodiment.

As illustrated in the drawing, a line of leakage magnetic field of 10 gauss (G) is reduced to 5 m which corresponds about half in a conventional device and proves a sufficient leakage magnetic field shielding effect with the present embodiment.

Hereinabove, several embodiments according to the present invention have been explained in which the super conducting coils are used.

However, the present invention is not limited to the use of the super conducting coils, for example, coils using such as copper wires can be used. Namely, the material of the coils is not limited, if the same can carry electric current.

Further, in the above embodiments, it is exemplified that the sum of absolute values of magnetomotive force of the lower magnet assembly is set larger than the sum of absolute values of the upper magnet assembly, however, the present invention is not limited to the above relationship in the respective embodiments, because the opposite relationship is sometimes preferable depending on diameters of respective magnet assemblies and offset degree of the uniform magnetic field region.

According to the present invention, the upper space for the patient laying on the bed can be extended without necessitating a large scale device which causes to increase the production cost thereof.

When the upper space for the patient is extended, claustrophobia of the patient during image taking operation is removed as well as an access of the operator to the patient is facilitated.

INDUSTRIAL FEASIBILITY OF THE INVENTION

As has been explained hitherto, the magnet device according to the present invention is applied to a medical treatment use MRI device, in particular, to an open type MRI device which extends upper space for the patient to thereby reduce claustrophobia of the patient as well as to permit interventional radiology by an operator.

What is claimed is:

1. An MRI device comprising, a magnet device which is provided with two static magnetic field generating sources disposed so as to oppose each other, one of said two static magnetic field generating sources having a magnetic moment greater than the other; and a movable table for inserting a patient between said two static magnetic field generating sources at a position offset toward one of said two static magnetic field generating sources.

2. An open type MRI device comprising, a pair of magnet assemblies which are opposing each other while sandwiching a space for receiving a person to be inspected and generate a space of static magnetic field in vertical direction therebetween; and a movable bed which carries and holds the person to be inspected in the static magnetic filed space sandwiched by said pair of magnet assemblies, wherein one of the magnet assemblies of said pair of magnet assemblies has a greater magnetic moment that the other, and the total magnetic moment generated respectively by said pair of magnet assemblies and the height of the movable bed in the static magnetic field space are selected in such a manner that a sufficient static magnetic field space is formed above the person to be inspected and the person to be inspected is arranged to be offset toward the lower magnet assembly during inspection thereof.

3. An open type MRI device comprising, a pair of magnet assemblies which are opposing each other while sandwiching a space for receiving a person to be inspected and generate a space of static magnetic field in vertical direction therebetween; wherein, said pair of magnet assemblies are constituted in such a manner that the magnetic moment generated by one of said magnet assemblies is larger than the magnetic moment generated by the other magnet assembly.

4. An open type MRI device according to claim 3, further comprising a movable bed which carries and holds the person to be inspected in the static magnetic field space formed by said pair of magnet assemblies, wherein, said pair of magnet assemblies are constituted in such a manner that the magnetic moment generated by the upper side magnet assembly is larger than the magnetic moment generated by the lower side magnet assembly, and said movable bed is controllably disposed in the static magnetic field space in such a manner that a space region formed between the bed and the uppers side magnet assembly in the course of inspection of the person to be inspected is substantially larger than a space region formed by the bed and the lower side magnet assembly.

5. An MRI system comprising:
  an upper magnet assembly and a lower magnet assembly that are spaced from each other to define a patient space between them and generate a vertically oriented static magnetic field across the patient space;
  wherein the upper magnet assembly generates a magnetic field of a different overall strength than the lower magnet assembly;
  said static magnetic field including an imaging volume at a substantially uniform magnetic field region between the upper and lower magnet assemblies;
  wherein said imaging volume is closer to the lower magnet assembly than to the upper magnet assembly; and
  wherein a patient centered at the imaging volume is closer to the lower magnet assembly than to the upper magnet assembly, leaving more space between the patient and the upper magnet assembly than between the patient and the lower magnet assembly.

6. An MRI system as in claim 5 including a patient table movable into the patient space to position a patient centered at the imaging volume.

7. A method of using an MRI system comprising:
  operating a magnet structure having upper and lower magnet assemblies that establish a vertically oriented static magnetic field between them, across a space for a patient, said static magnetic field including an imaging volume at a substantially uniform magnetic field region, said imaging volume being between the upper and lower magnet assemblies but closer to the lower magnet assembly,and said upper magnet assembly having a greater magnetic moment than the lower magnet assembly; and
  positioning a patient in said space, with the patient being closer to the lower magnet assembly than to the upper magnet assembly to leave substantially more free space between the patient and the upper magnet assembly than between the patient and the lower magnet assembly.

* * * * *